(12) United States Patent
Horikawa et al.

(10) Patent No.: US 9,383,086 B2
(45) Date of Patent: Jul. 5, 2016

(54) PLANAR LIGHTING DEVICE AND MOUNTING SUBSTRATE INCLUDING CONDUCTION PATTERN WITH EXTENSION PARTS

(71) Applicant: MINEBEA CO., LTD., Kitasaku-Gun, Nagano (JP)

(72) Inventors: Tomotaka Horikawa, Fukuroi (JP); Makoto Furuta, Fukuroi (JP); Hidekazu Kasai, Fukuroi (JP); Namiko Suzuki, Iwata (JP)

(73) Assignee: Minebea Co., Ltd., Nagano (JP)

( * ) Notice: Subject to any disclaimer, the term of this patent is extended or adjusted under 35 U.S.C. 154(b) by 623 days.

(21) Appl. No.: 13/739,308

(22) Filed: Jan. 11, 2013

(65) Prior Publication Data

US 2013/0188394 A1  Jul. 25, 2013

(30) Foreign Application Priority Data

Jan. 20, 2012  (JP) .................................. 2012-009647

(51) Int. Cl.
*F21V 8/00* (2006.01)
*F21V 21/00* (2006.01)
(Continued)

(52) U.S. Cl.
CPC .............. *F21V 21/00* (2013.01); *G02B 6/0068* (2013.01); *G02B 6/0073* (2013.01);
(Continued)

(58) Field of Classification Search
CPC .. G02B 6/0083; G02B 6/0073; G02B 6/0068; F21V 19/0025; F21V 19/002; F21V 19/0015; F21V 19/001; F21Y 2101/02; H05K 2201/09372

USPC ................................................... 362/612–613
See application file for complete search history.

(56) References Cited

U.S. PATENT DOCUMENTS

2003/0060062 A1  3/2003  Honda et al.
2006/0180340 A1  8/2006  Tanaka et al.
(Continued)

FOREIGN PATENT DOCUMENTS

JP     2003101173 A    4/2003
JP     2004-233809 A   8/2004
(Continued)

OTHER PUBLICATIONS

Office Action issued on Jul. 28, 2015 in the corresponding Japanese Patent Application No. 2012-009647.
(Continued)

*Primary Examiner* — Robert May
(74) *Attorney, Agent, or Firm* — Carrier Blackman & Associates, P.C.; Joseph P. Carrier; Jeffrey T. Gedeon

(57) ABSTRACT

A planar lighting device comprises: a mounting substrate having a conduction pattern having an extension part formed on a base material, and a cover member is arranged on the conduction pattern, wherein the cover member has an opening that exposes together the two lands of the two adjacent light sources, and wherein the extension parts comprise: a first extension part formed to extend from a first end portion of the lands toward the light guide plate and to extend under the cover member; a second extension part formed to extend from a second end portion, toward the light guide plate and the other land of the pair of the lands and to extend under the cover member; and a third extension part formed to extend from the first end portion, toward an opposite side to the light guide plate and to extend under the cover member.

13 Claims, 5 Drawing Sheets

(51) Int. Cl.
*H05K 1/18* (2006.01)
*H05K 1/11* (2006.01)
*H05K 3/28* (2006.01)

(52) U.S. Cl.
CPC ............ *G02B 6/0083* (2013.01); *H05K 1/111* (2013.01); *H05K 1/189* (2013.01); *H05K 3/281* (2013.01); *H05K 2201/099* (2013.01); *H05K 2201/0969* (2013.01); *H05K 2201/09381* (2013.01); *H05K 2201/09727* (2013.01); *H05K 2201/10106* (2013.01); *H05K 2203/048* (2013.01); *Y02P 70/611* (2015.11)

(56) References Cited

U.S. PATENT DOCUMENTS

| 2007/0170452 A1* | 7/2007 | Kurokawa et al. ............ 257/99 |
| 2007/0201247 A1* | 8/2007 | Ohno et al. ................... 362/631 |
| 2009/0201699 A1* | 8/2009 | Ohno ........................... 362/634 |
| 2010/0053493 A1 | 3/2010 | Kuwajima et al. |
| 2010/0061089 A1* | 3/2010 | Lin et al. ...................... 362/218 |

FOREIGN PATENT DOCUMENTS

| JP | 2005101187 A | 4/2005 |
| JP | 2006222386 A | 8/2006 |
| JP | 2006-237320 A | 9/2006 |
| JP | 2008059987 A | 3/2008 |
| JP | 2010062016 A | 3/2010 |

OTHER PUBLICATIONS

Office Action issued on Mar. 15, 2016 in the corresponding Japanese Patent Application No. 2012-009647.

* cited by examiner

PLANAR LIGHTING DEVICE AND MOUNTING SUBSTRATE INCLUDING CONDUCTION PATTERN WITH EXTENSION PARTS

CROSS-REFERENCE TO RELATED APPLICATION

This application claims priority from Japanese Patent Application No. 2012-009647 filed on Jan. 20, 2012, the entire subject matter of which is incorporated herein by reference.

TECHNICAL FIELD

This disclosure relates to a planar lighting device of a side light type in which a light source is arranged at a side of a light guide plate.

BACKGROUND

In recent years, a backlight that is used for a liquid crystal display device and the like is required to have higher brightness so as to further improve the visibility of a display screen.

However, in a pattern shape of current connection wirings formed on a circuit substrate having an LED (Light Emitting Diode) as a light source mounted thereon, a distance between the LEDs to be mounted is limited, so that there is a limit on the number of the LEDs.

In the meantime, the known references relating to this disclosure is JP-A-2004-233809 and JP-A-2006-237320, for example.

FIG. 5A is a plan view illustrating a light source unit of a side light-type backlight according to the background art and FIG. 5B is an enlarged plan view of an example of a substrate (circuit substrate having an LED mounted thereon) in the light source unit of the side light-type backlight according to the background art.

As shown in FIG. 5A, according to the side light-type backlight of the background art, a plurality of LEDs 101 mounted on a substrate 102 is arranged with contacting a side end face 103s of a light guide plate 103. The plurality of LEDs 101 illuminates the light from the side end face 103s of the light guide plate 103 to an inside thereof.

The substrate 102 on which the plurality of LEDs 101 is mounted is an FPC (Flexible Printed Circuit) and a face thereof is covered with an insulating coverlay 104, as shown in FIG. 5B. A land 102r, to which a pair of electrodes (not shown) of each LED 101 is respectively connected, is exposed from an opening 104k of the coverlay 104, including a part of a connection wiring (conduction wiring) connected to the land 102r. In other words, a part of the connection wiring connecting the opposed lands 102r of the adjacent LEDs 101 is covered by a part of the coverlay 104. On the substrate 102, a plurality of pairs of lands 102r, each pair of which corresponds to the pair of electrodes of each LED 101, is arranged at an interval of a pitch pt1 (refer to FIG. 5B).

SUMMARY

Meanwhile, the backlight, i.e., planar lighting device of the liquid crystal panel that is used for a PDA (Personal Digital Assistance) and the like is required to have the higher brightness. A configuration is considered in which more LEDs 101 are arranged on a light incidence face (side end face 103s) that is a side face of the light guide plate 103. In this case, following two problems are caused.

As a first problem, as disclosed in JP-A-2004-233809, when all the LEDs are serially driven, a driving voltage is excessively increased.

As a second problem, as disclosed in JP-A-2006-237320, it is difficult to provide the coverlay between the adjacent LEDs due to limits on the coverlay processing and the adhesion position precision of the connection wiring. If there is no coverlay on the connection wiring arranged between the adjacent LEDs, the break may be caused due to insufficient adhesion strength.

With respect to the first problem of the above two problems, the configuration of JP-A-2004-233809, i.e., all the LEDs 101 are divided into a plurality of groups and are then driven, so that it is possible to decrease the driving voltage.

However, regarding the second problem, when the configuration of JP-A-2004-233809 is adopted, i.e., all the LEDs 101 are divided into a plurality of groups and are then arranged so that the LEDs belonging to the different groups are adjacent to each other, it is not possible to directly adopt the connection wiring disclosed in JP-A-2006-237320.

In detail, it is premised in JP-A-2006-237320 that the adjacent LEDs are serially connected each other, and but the LEDs belonging to the adjacent different groups are connected in the configuration of JP-A-2004-233809. That is, according to JP-A-2004-233809, the LEDs belonging to the same group are serially connected each other, so that it is not possible to serially connect the LEDs belonging to the adjacent different groups.

In addition to the above second problem, in order to stably secure the lighting characteristics (high brightness and uniform lighting) of the planar lighting device with a high level, it is necessary to fix all the LEDs at predetermined positions with high precision. Accordingly, it is necessarily required to perform the self-alignment with high precision upon the mounting of the LEDs on (the lands of) the FPC.

With considering the above, this disclosure provides at least a planar lighting device having high reliability and capable of stably realizing high brightness and uniform lighting.

In this disclosure, a planar lighting device of this disclosure comprises: a light guide plate; a plurality of light sources that is arranged in a line shape along a longitudinal direction of a side end face of the light guide plate, and a mounting substrate, on which the light sources are respectively mounted. The mounting substrate has a base material and a conduction pattern formed on the base material, and a cover member is arranged on the conduction pattern, the conduction pattern comprises a plurality of pairs of lands, which is provided in the longitudinal direction to be corresponding to a pair of electrode terminals of each light source and to which the pair of electrode terminals is respectively connected, and extension parts that are respectively connected to the pair of lands, the cover member has an opening that exposes together the two lands, which face each other, of the two pairs of lands, which are respectively corresponding to the two adjacent light sources. The extension parts comprise: a first extension part that is formed to extend from a first end portion of the lands, which faces the land of the adjacent light source, toward the light guide plate and to extend under the cover member; a second extension part that is formed to extend from a second end portion, which is opposite to the first end portion of the corresponding land in the longitudinal direction, toward the light guide plate and the other land of the pair of the lands and to extend under the cover member; and a third extension part that is formed to extend from the first end portion, to which the first extension part is provided, toward an opposite side to the light guide plate and to extend under the cover member.

According to the above planar lighting device, the cover member provided on the conduction pattern has an opening that exposes together the two lands, which face each other, of the two pairs of lands, which are respectively corresponding to the two adjacent light sources, and the extension parts comprise: a first extension part that is formed to extend from a first end portion of the lands, which faces the land of the adjacent light source, toward the light guide plate and to extend under the cover member; a second extension part that is formed to extend from a second end portion, which is opposite to the first end portion of the corresponding land in the longitudinal direction, toward the light guide plate and the other land of the pair of the lands and to extend under the cover member; and a third extension part that is formed to extend from the first end portion, to which the first extension part is provided, toward an opposite side to the light guide plate and to extend under the cover member. Therefore, it is possible to suppress the conduction pattern and the light sources from being peeled off from the mounting substrate while performing the self-alignment with high precision when mounting the light source on the mounting substrate. Also, it is possible to mount the light sources on the mounting substrate while narrowing an interval of the light sources as much as possible. Thereby, it is possible to realize the high brightness and uniform lighting of the planar lighting device.

In the above-described planar lighting device, the third extension part may be formed to be wider or to have a larger area than the first extension part. According to this planar lighting device, the third extension part is formed to be wider or to have a larger area than the first extension part at the light guide plate-side of the light source. Therefore, it is possible to make the areas of the conduction pattern uniform at the light guide plate-side of the light source and at an opposite side to the light guide plate.

In the above-described planar lighting device, the second extension part, which is provided to each light source, may have a wide shape so that a gap having a stripe shape is formed between the second extension part of one of the pair of the lands and the second extension part of the other of the pair of the lands. According to this planar lighting device, the second extension part has a wide shape in which a gap having a stripe shape is formed between the second extension parts. Therefore, it is possible to suppress the second extension part from being peeled off from the mounting substrate.

In the above-described planar lighting device, the conduction pattern may comprise a wiring pattern to which at least a part of the extension part is electrically connected, and the wiring pattern may be formed so that the one light source can be driving-controlled independently from the other adjacent light source. According to the above planar lighting device, the light source can be driving-controlled independently from the other adjacent light source.

In this disclosure, a planar lighting device comprises: a light guide plate; a plurality of light sources that is arranged in a line shape along a longitudinal direction of a side end face of the light guide plate, and a mounting substrate on which the light sources are respectively mounted. A cover member is arranged on a conduction pattern that is formed on a base material of the mounting substrate, the conduction pattern comprises a plurality of pairs of lands, which is provided with centering around the light source in the longitudinal direction to be corresponding to a pair of electrode terminals of each light source and to which the pair of electrode terminals is respectively connected, and extension parts that are connected to the pair of lands, and the cover member has an opening that exposes the two lands, which face each other, of the two pairs of lands, which are respectively corresponding to the two adjacent light sources. The extension part comprises: an outside extension part is formed to extend from a first end portion of the lands, which faces the land of the adjacent light source, toward the light guide plate and an opposite side to the light guide plate and to extend under the cover member; and an inside extension part that is formed to extend from a second end portion, which is opposite to the first end portion of the corresponding land in the longitudinal direction, toward the light guide plate and to extend under the cover member.

According to the above planar lighting device, the cover member that is provided on the conduction pattern has an opening that exposes the two lands, which face each other, of the two pairs of lands, which are respectively corresponding to the two adjacent light sources. The extension part comprises: an outside extension part is formed to extend from a first end portion of the lands, which faces the land of the adjacent light source, toward the light guide plate and an opposite side to the light guide plate and to extend under the cover member; and an inside extension part that is formed to extend from a second end portion, which is opposite to the first end portion of the corresponding land in the longitudinal direction, toward the light guide plate and to extend under the cover member. Therefore, it is possible to suppress the conduction pattern and the light sources from being peeled off from the mounting substrate while performing the self-alignment with high precision when mounting the light source on the mounting substrate. Also, it is possible to mount the light sources on the mounting substrate while narrowing an interval of the light sources as much as possible. Thereby, it is possible to realize the high brightness and uniform lighting of the planar lighting device.

In the above-described planar lighting device, a gap may be formed between a pair of the inside extension parts that is provided to each light source. According to this planar lighting device, the gap is formed between a pair of the inside extension parts. Therefore, it is possible to enable the pair of inside extension parts to be wide or to have a large area, respectively, so that it is possible to suppress the inside extension parts from being peeling off from the mounting substrate.

In the above-described planar lighting device, wherein an area of the outside extension part, which extends toward the opposite side to the light guide plate, is formed to be wider or to have a larger area than an area extending toward the light guide plate.

According to the above planar lighting device, an area of the outside extension part, which extends toward the opposite side to the light guide plate, may be formed to be wider or to have a larger area than an area extending toward the light guide plate. Therefore, it is possible to suppress or reduce the non-uniformity of the areas of the conduction pattern at the light guide plate-side of the light source and an opposite side thereof to the light guide plate.

In the above-described planar lighting device, the one light source may be driving-controlled independently from the other adjacent light source. According to this planar lighting device, it is possible to perform the independent driving control between the adjacent light sources.

In the above-described planar lighting device, the mounting substrate may be a flexible printed circuit board. According to this lighting device, it is possible to narrow a space of the planar lighting device.

In this disclosure, a mounting substrate, on which light sources are respectively mounted along a longitudinal direction of the mounting substrate, comprises: a base material; a conduction pattern that is formed on a base material; and a cover member that is arranged on the conduction pattern. The conduction pattern comprises a plurality of pairs of lands, which is provided with centering around the light source in the longitudinal direction to be corresponding to a pair of electrode terminals of each light source and to which the pair of electrode terminals is respectively connected, and extension parts that are connected to the pair of lands, and the cover member has an opening that exposes both one of the pair of the lands of a first light source and one of the pair of the lands of a second light source, which face each other. The extension part comprises: a first extension part that is formed to extend from one end of the lands in a first direction and a second direction, which is opposite to the first direction, and to extend under the cover member; and a second extension part that is formed to extend from one end of the lands in the first direction and a direction toward the other land of the pair of the lands of the respective light sources and to extend under the cover member.

According to this disclosure, it is possible to provide a planar lighting device having high reliability and capable of stably realizing high brightness and uniform lighting.

BRIEF DESCRIPTION OF THE DRAWINGS

The foregoing and additional features and characteristics of this disclosure will become more apparent from the following detailed descriptions considered with the reference to the accompanying drawings, wherein.

DETAILED DESCRIPTION

Hereinafter, an illustrative embodiment of this disclosure will be described with reference to the accompanying drawings.

Figure 1A:
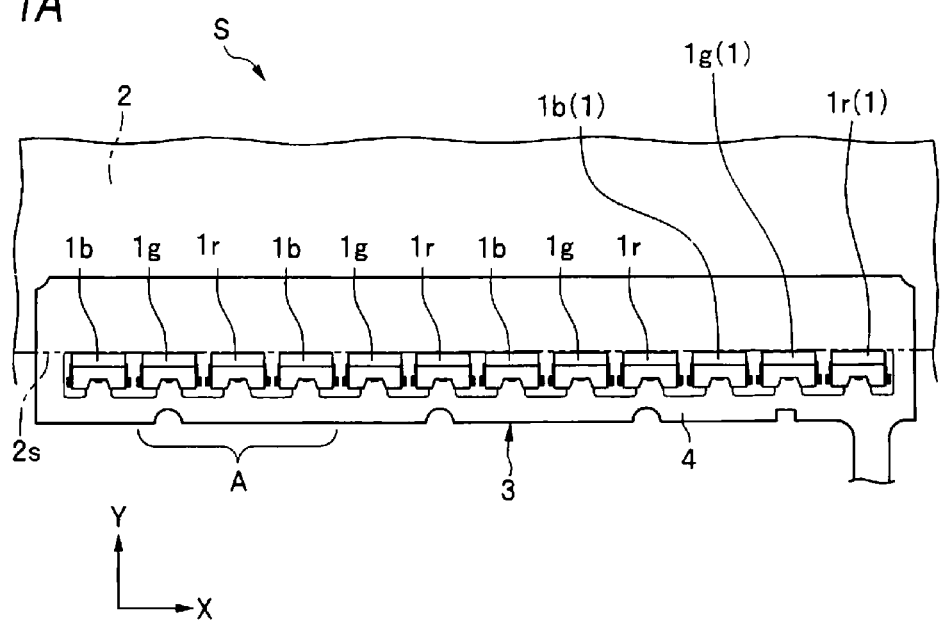
FIG. 1A is a plan view illustrating a planar lighting device according to an illustrative embodiment of this disclosure.
Figure 1B:
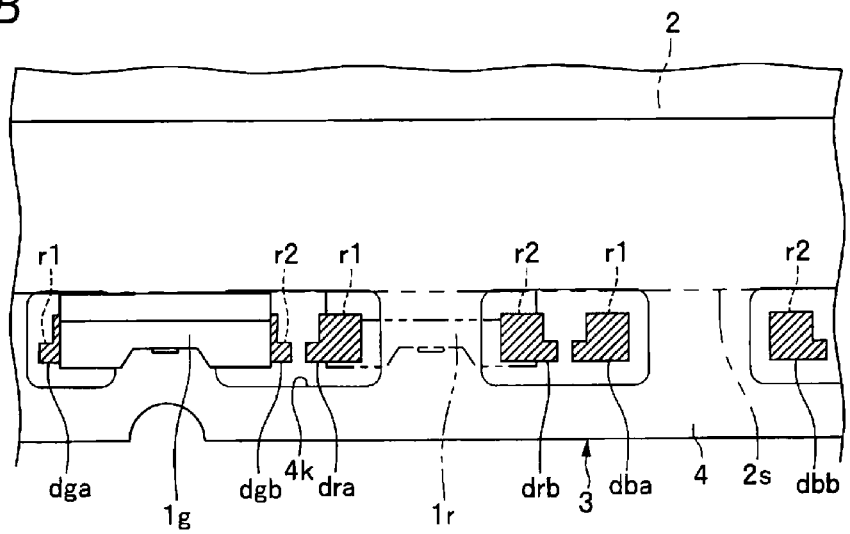
FIG. 1B is an enlarged view of an A part of FIG. 1A.

FIG. 1A is a plan view illustrating a planar lighting device according to an illustrative embodiment of this disclosure, and FIG. 1B is an enlarged view of an A part of FIG. 1A.

Figure 2:
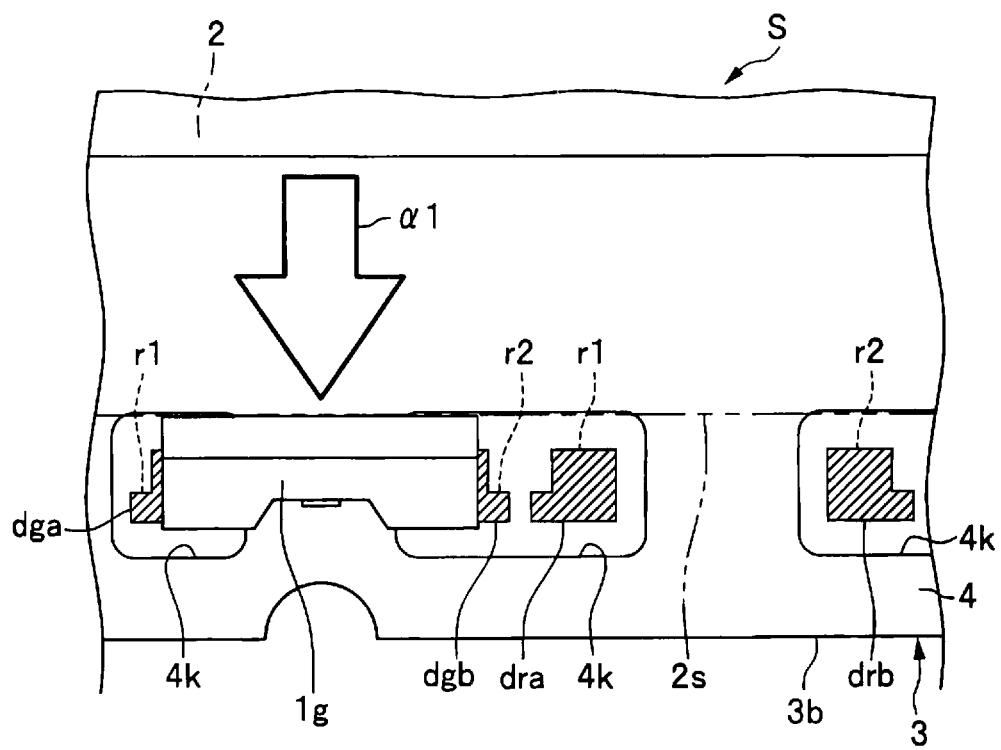
FIG. 2 is an enlarged view illustrating a light guide plate and a state where LEDs are mounted on an FPC according to the illustrative embodiment.

FIG. 2 is an enlarged view illustrating a light guide plate and a state where LEDs are mounted on an FPC according to the illustrative embodiment.

A planar lighting device S of an illustrative embodiment is a planar lighting device that is used for a backlight of a liquid crystal panel and the like and illuminates light from the rear.

The planar lighting device S is a lighting device called as a side light-type backlight in which LEDs (Light Emitting Diodes) as a light source are arranged on a side of a light guide plate 2.

Specifically, according to the planar lighting device S, a plurality of LEDs 1 (1r, 1g, 1b) is mounted on an FPC 3, is arranged with contacting a side end face 2s of a light guide plate 2 and illuminates light toward the light guide plate 2. In the meantime, the LEDs 1 are all white LEDs and the white LEDs are classified into three groups of the LEDs 1r, the LEDs 1g and the LEDs 1b. That is, the LEDs 1r are LEDs belonging to the first group of the white LEDs, the LEDs 1g are LEDs belonging to the second group of the white LEDs and the LEDs 1b are LEDs belonging to the third group of the white LEDs.

A reflective sheet (not shown) that reflects light, which deviates from a total reflection condition of the light guide plate 2 and leaks rearwards, to the front (the front side in the sheet of FIG. 1A) is arranged at the rear (back side in the sheet of FIG. 1A) of the light guide plate 2. In the meantime, a diffusion sheet that diffuses the light, a prism sheet (not shown) for increasing brightness and the like are arranged at the front (the front side in the sheet of FIG. 1A) of the light guide plate 2.

Figures 3A, 3B:
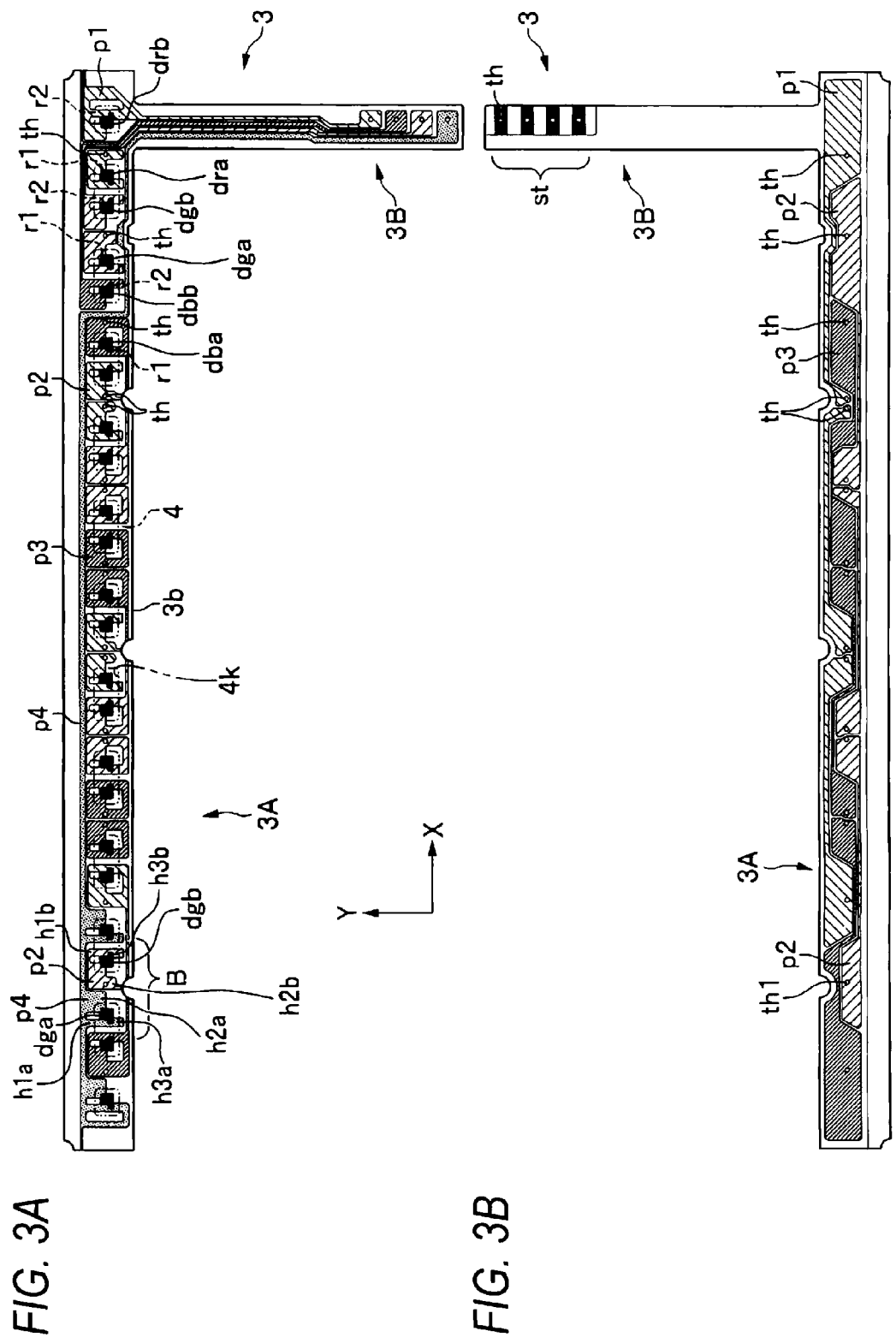
FIG. 3A is a plan view illustrating a front face of the FPC according to the illustrative embodiment.
FIG. 3B is a plan view illustrating a back face of the FPC according to the illustrative embodiment.

FIG. 3A is a plan view illustrating a front face of the FPC according to the illustrative embodiment, and FIG. 3B is a plan view illustrating a back face of the FPC according to the illustrative embodiment. Meanwhile, in FIG. 3A, electrode terminals dra, drb, dga, dgb, dba, dbb of the LEDs 1 are shown with black so as to clarify a positional relation with conduction patterns r1, r2, h1a, h1b, h2a, h2b, h3a, h3b exposed from openings 4k of a coverlay 4, irrespective of the groups to which the LEDs belong.

Figure 4:
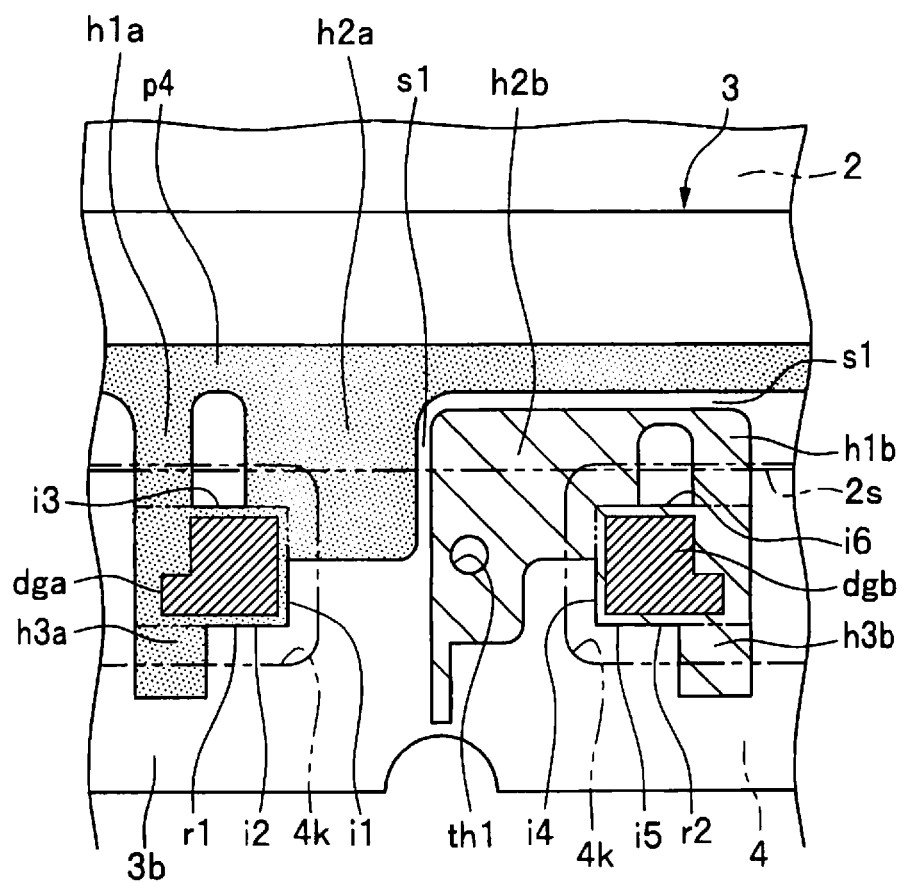
FIG. 4 is an enlarged view illustrating an example of a conduction pattern of a part on which one LED is mounted.
Figure 5A:
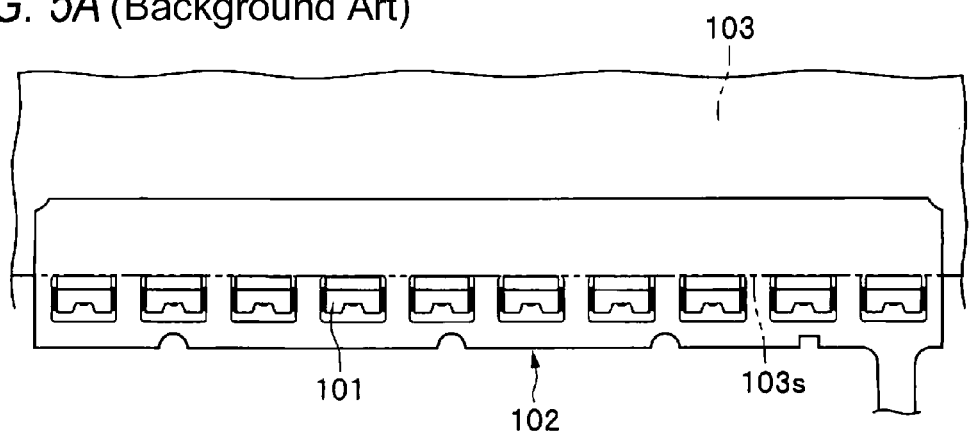
FIG. 5A is a plan view illustrating a light source unit of a side light-type backlight of the background art.
Figure 5B:
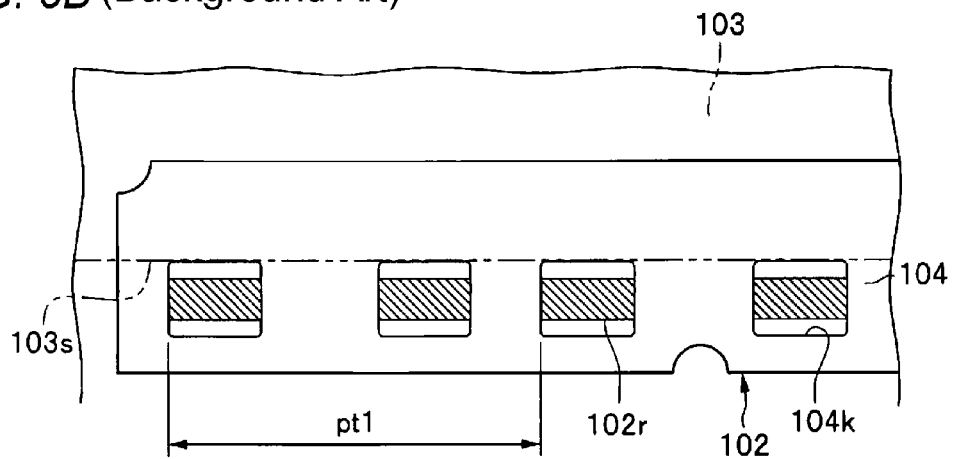
FIG. 5B is an enlarged plan view illustrating an example of a substrate (circuit board on which an LED is mounted) in the light source unit of the side light-type backlight of the background art.

FIG. 4 is an enlarged view illustrating an example (around a pair of lands in a B part of FIG. 3A) of a conduction pattern of a part on which one LED is mounted. Meanwhile, in the B part of FIG. 3A, the LED 1g of the second group is arranged. The face and back face of the FPC 3 are formed with wiring patterns p1, p2, p3, p4, lands r1, r2 and extension parts h1a, h1b, h2a, h2b, h3a, h3b (refer to FIG. 4), which are conduction patterns of a conductive foil such as copper, formed by etching and the like. That is, not only the wiring patterns p1, p2, p3 but also the lands r1, r2 and the extension parts h1a, h1b, h2a, h2b, h3a, h3b are conductive conduction patterns.

As shown in FIGS. 3A and 4, the coverlay 4 is arranged on the lands r1, r2 and the extension parts h1a, h1b, h2a, h2b, h3a, h3b (which are the conduction patterns of the FPC 3) so that the facing lands r2, r1 of the pair of lands r1, r2, which face each other, of two sets of the adjacent LEDs 1 are integrally exposed from the openings 4k. In other words, both one land of the pair of lands r1, r2 of one LED 1(1r) and one land of the pair of lands r1, r2 of other LED1 (1g or 1b), which is adjacent to one LED, are integrally exposed from the opening 4k. Meanwhile, in FIGS. 3A and 4, the coverlay 4 (openings 4k) is shown with the dashed-two dotted line.

That is, the surface (refer to FIG. 3A) of the FPC 3 is covered with the coverlay 4 having the openings 4k. The coverlay 4 is an insulating material having heat resistance and adhesiveness.

The pair of electrode terminals dra, drb, the pair of the electrode terminals dga, dgb and the pair of the electrode terminals dba, dbb of the adjacent LEDs 1 (1r, 1g, 1b) are soldered, fixed and electrically connected to the respective corresponding lands r1, r2 over areas of the coverlay 4 between the openings 4k. Thereby, the respective LEDs 1 are mounted on the FPC 3.

For example, in the case of the rightmost LED 1r of the first group of the FPC 3 in FIG. 1A, the electrode terminal dra thereof is soldered to the land r1 (refer to FIG. 4) through the opening 4k of the coverlay 4 and the electrode terminal drb is soldered to the land r2 (refer to FIG. 4) through the opening 4k of the coverlay 4, as shown in FIGS. 1B and 3A.

Likewise, in the case of the LED 1g of the second group of the FPC 3 at the second position from the right in FIG. 1A, the electrode terminal dga thereof is soldered to the land r1 through the opening 4k of the coverlay 4 and the electrode terminal dgb is soldered to the land r2 through the opening 4k of the coverlay 4, as shown in FIGS. 3A and 4.

Likewise, in the case of the LED 1b of the third group of the FPC 3 at the third position from the right in FIG. 1A, the electrode terminal dba thereof is soldered to the land r1 through the opening 4k of the coverlay 4 and the electrode terminal dbb is soldered to the land r2 through the opening 4k of the coverlay 4, as shown in FIG. 3A. The other LEDs 1 are also mounted on the FPC 3 in the same manner.

Like this, the coverlay 4 (the coverlay 4 between the openings 4k) is arranged between the lands r1, r2 of the LED 1. In order to achieve a narrow pitch of the LEDs 1, the conduction patterns r1, r2, h1a, h1b, h2a, h2b, h3a, h3b, p1 to p4 are shaped as described below.

Here, the backlight has a structure (design) where the LEDs 1 are abutted (contacted) and assembled on the side end face 2s of the light guide plate 2, as shown with a white arrow α1 of FIG. 2. Therefore, the peeling strength of the LED 1 from the FPC 3, i.e., the fixing strength of the LED 1 to the FPC 3 is very important.

In the abutting process, an external force is applied so that the wiring (conduction pattern) of the FPC 3 at the light guide plate 2-side (at the front) uplifts from (a base material 3b of) the FPC 3, and also an external force is applied so that the wiring (conduction pattern) at an opposite side (at the rear) of the light guide plate 2 is pressed to the FPC 3. Accordingly, the wiring at the light guide plate 2-side (at the front) is more apt to be peeled off from the base material 3b than the wiring of the opposite side (at the rear) of the light guide plate 2.

<FPC 3>

The FPC 3 of FIG. 3, in which both sides thereof are formed with the wiring patterns, is configured to mount the LEDs 1 that are the twelve white LEDs, as shown in FIG. 1A. As described above, the twelve LEDs 1 are classified into the three groups, i.e., the LEDs 1r belonging to the first group, the LEDs 1g belonging to the second group and the LEDs 1b belonging to the third group, and each group has four LEDs 1 (1r, 1g, 1b). That is, the twelve LEDs 1 are configured by the four LEDs 1r of the first group, the four LEDs 1g of the second group and the four LEDs 1b of the third group.

The twelve LEDs 1 (1r, 1g, 1b) are arranged so that four units are repeated from one end (right end) of the FPC 3 toward the other end (left end), in which one unit is configured by the LED 1r of the first group, the LED 1g of the second group and the LED 1b of the third group.

As shown in FIG. 3, the LEDs 1 (1r, 1g, 1b) belonging to the respective groups are serially connected each other. That is, the LEDs 1r of the first group of the twelve LEDs 1 are serially connected each other, the LEDs 1g of the second group are serially connected each other and the LEDs 1b of the third group are serially connected each other.

Specifically, the FPC 3 shown in FIG. 3 has the base material 3b and the conduction patterns (p1 to p4, h1a, h1b, h2a, h2b, h3a, h3b, r1, r2) formed on the base material 3b. The FPC 3 has an LED mounting part 3A on which the LEDs 1 are mounted, the wiring patterns p1 to p4 for connection to the LEDs 1 and a wiring part 3B in which a connection terminal st (refer to FIG. 3B) to be electrically connected to the wiring patterns is provided.

The front face and back face of the FPC 3 are formed with the wiring patterns p1, p2, p3, p4 for supplying current (voltage) to the LEDs 1 (1r, 1g, 1b) by the etching and the like, together with the lands r1, r2 to which the respective LEDs 1 are connected and the extension parts h1a, h1b, h2a, h2b, h3a, h3b.

The FPC 3 is formed with through-holes th for electrically connecting the wiring patterns p1 to p4 on the face shown in FIG. 3A and the wiring patterns p1 to p4 on the backside shown in FIG. 3B.

The pair of electrode terminals dra, drb of the LED 1r belonging to the first group is connected to the wiring pattern p1, the pair of electrode terminals dga, dgb of the LED 1g belonging to the second group is connected to the wiring pattern p2, and the pair of electrode terminals dba, dbb of the LED 1b belonging to the third group is connected to the wiring pattern p3. In the meantime, the wiring pattern p4 is a ground line.

That is, the respective four LEDs 1r of the first group are serially connected through the wiring pattern p1 and through-holes th formed on the face and back face of the FPC 3. Also, the respective four LEDs 1g of the second group are serially connected through the wiring pattern p2 and through-holes th formed on the face and back face of the FPC 3. Likewise, the respective four LEDs 1b of the third group are serially connected through the wiring pattern p3 and through-holes th formed on the face and back face of the FPC 3.

As shown in FIG. 1, regarding the LED 1 as one point-like light source and the LED 1 as the other adjacent point-like light source, the LEDs belonging to the different groups are arranged. That is, the LED 1g of the second group is arranged in the vicinity of the LED 1r of the first group, the LED 1b of the third group is arranged in the vicinity of the LED 1g of the second group and the LED 1r of the first group is arranged in the vicinity of the LED 1b of the third group.

Like this, the LED 1 of the point-like light source and the LED 1 as the point-like light source belonging to the other adjacent group are adapted so that they can be independently driving-controlled through the wiring patterns p (p1, p2, p3). That is, the LED 1r of the first group, the LED 1g of the second group and the LED 1b of the third group are connected so that they can be independently driving-controlled through the wiring patterns p1 to p4, respectively.

Meanwhile, in this illustrative embodiment, the configuration has been exemplified in which the LEDs 1 (1r, 1g, 1b) of the three adjacent sets (three adjacent groups) can be independently driving-controlled. However, a wiring pattern may be also formed so that the two sets (two groups) or four sets (four groups) or more can be independently driving-controlled.

<Conduction Patterns>

In the below, the features of the conduction patterns (p1 to p4, r1, r2, h1a, h1b, h2a, h2b, h3a, h3b) of the FPC 3 of this illustrative embodiment are described with reference to FIG. 4.

In FIG. 4, in order to clarify a positional relation between the electrode terminals dga, dgb of the LED 1g of the second group and the conduction patterns r1, r2, h1a, h1b, h2a, h2b, h3a, h3b, the electrode terminals dga, dgb having an L shape of the LED 1g of the second group are blackly shown to overlap over the lands r1, r2.

As described above, the pairs of electrode terminals dra, drb, dga, dgb, dba, dbb of the respective LEDs 1 (refer to FIG.

1) are respectively soldered and fixed to the lands r1, r2 having a rectangular shape shown in FIG. 4.

The conduction patterns formed on the FPC 3 have following features.

First, the first extension part h1a that is a wiring is formed which extends from one corner (end portion), which is an outer side (left side of the land r1 in FIG. 4) of the one land r1 (which is shown with the solid line and dashed-two dotted line in FIG. 4) having a rectangular shape, i.e., a side facing the LED 1b (refer to FIG. 1A) of the third group adjacent at the left side of FIG. 4 opposite to the other land r2 in the X direction (longitudinal direction of the FPC 3) of FIG. 4, and which is a side (in the Y direction (width direction of the FPC 3)) at which the light guide plate 2 is arranged, toward the light guide plate 2.

The first extension part h1a has a rectangular shape and is connected to the wiring pattern p4. In the first extension part h1a, a part thereof at the land r1-side is exposed from the opening 4k (which is shown with the dashed-two dotted line in FIG. 4) of the coverlay 4 and the other part thereof is covered by the coverlay 4. A leading end of the first extension part h1a is electrically connected to the wiring pattern p4.

Also, the first extension part h1b that is a wiring is formed which extends from one corner (end portion) of an outer side (right side of the land r2 in FIG. 4) of the other land r2 (which is shown with the solid line and dashed-two dotted line in FIG. 4) having a rectangular shape, i.e., a side facing the LED 1r (refer to FIG. 1A) of the first group adjacent at the right side of FIG. 4 opposite to the one land r1 in the X direction (longitudinal direction of the FPC 3) of FIG. 4, which is a side (in the Y direction (width direction of the FPC 3)) at which the light guide plate 2 is arranged, toward the light guide plate 2.

The first extension part h1b has a rectangular shape. The first extension part h1b is electrically connected to the second extension part h2b that will be described later, and is electrically connected to the wiring pattern p2 (refer to FIG. 3B) formed on the backside, through the through-hole th1.

Second, the second extension part h2a that is a wiring is formed which extends from one corner of an inner side (a side facing the other land r2 in the X direction in FIG. 4) of one land r1, at which the light guide plate 2 is arranged, toward the light guide plate 2.

The second extension part h2a has a wide shape so that it extends toward the light guide plate 2 and the other land r2. The second extension part h2a has a wide shape extending up to a level at which a gap s1 having a stripe shape is formed between the second extension part h2a and the pairing second extension part h2b that will be described below. In the second extension part h2a, most of parts (areas) except for a part (area) facing the land r1 are covered by the coverlay 4 and the part (area) facing the land r1 is exposed from the opening 4k (which is shown with the dashed-two dotted line in FIG. 4) of the coverlay 4.

That is, a space, which is inevitably formed between the pair of lands r1, r2 by the structure of the electrode terminals dga, dgb of the LED 1g of the second group, is effectively used to form the second extension part h2a of the conduction pattern. In the meantime, the second extension part h2a is directly and electrically connected to the wiring pattern p4.

Also, the second extension part h2b that is a wiring is formed which extends from one corner of an inner side (a side facing the one land r1 in the X direction in FIG. 4) of the other land r2, at which the light guide plate 2 is arranged, toward the light guide plate 2.

The second extension part h2b has a wide shape so that it extends toward the light guide plate 2 and the other land r1. The second extension part h2b has a wide shape extending up to a level at which a gap s1 having a stripe shape is formed between the second extension part h2b and the pairing second extension part h2a.

In the second extension part h2b, most of parts (areas) except for a part (area) facing the land r2 are covered by the coverlay 4 and the part (area) facing the land r2 is exposed from the opening 4k of the coverlay 4. That is, the space, which is inevitably formed between the pair of lands r1, r2 by the structure of the electrode terminals dga, dgb of the LED 1g of the second group, is effectively used to form the second extension part h2a of the conduction pattern.

As described above, the second extension part h2b is directly and electrically connected to the wiring pattern p2 (refer to FIG. 3B) formed on the backside, through the through-hole th1.

By the above configuration, one electrode dga of the LED 1g of the second group is connected from the first and second extension parts h1a, h2a to the wiring pattern p4 and the other electrode dgb thereof is connected from the first and second extension parts h1b, h2b to the wiring pattern p2 (refer to FIG. 3B) on the backside through the through-hole th1. In the same manner, the other LEDs 1g of the second group are serially connected to the wiring pattern p2.

Likewise, the LED 1r of the first group and the LED 1b of the third group are soldered to the pair of corresponding lands r1, r2, the LED 1r of the first group is serially connected to the wiring pattern p1 and the LED 1b of the third group is serially connected to the wiring pattern p3.

Thereby, the LEDs 1 of the same group in the four units are directly connected independently from the LEDs 1 of the other groups.

As described above, the LEDs 1r of the first group in the four units are directly connected through the wiring pattern p1, independently from the LEDs 1g of the second group and the LEDs 1b of the third group, as shown in FIG. 3.

Also, the LEDs 1g of the second group in the four units are directly connected through the wiring pattern p2, independently from the LEDs 1r of the first group and the LEDs 1b of the third group, as shown in FIG. 3.

Likewise, the LEDs 1b of the third group in the four units are directly connected through the wiring pattern p3, independently from the LEDs 1r of the first group and the LEDs 1g of the second group, as shown in FIG. 3.

Third, as shown in FIG. 4, the third extension part h3a that is a wiring formed which extends from one corner of an opposite side to the side of the one land r1 in the Y direction, at which the light guide plate 2 is arranged, to the opposite side to the light guide plate 2 toward the outer side. A leading end of the third extension part h3a extends so that it is covered by the coverlay 4, and a root part thereof (a side that is connected to the land r1) is exposed from the opening 4k of the coverlay 4.

A width of the third extension part h3a is wider than that of the first extension part h1a that is connected to the land r1.

Likewise, the third extension part h3b that is a wiring is formed which extends from one corner of an opposite side to the side of the other land r2 in the Y direction, at which the light guide plate 2 is arranged, to the opposite side to the light guide plate 2 toward the outer side. A leading end of the third extension part h3b extends so that it is covered by the coverlay 4, and a root part thereof (a side that is connected to the land r2) is exposed from the opening 4k of the coverlay 4.

A width of the third extension part h3b is wider than that of the first extension part h1b that is connected to the land r2.

Meanwhile, in FIG. 4, the configuration has been exemplified in which the leading ends of the third extension parts h3a, h3b are electrically opened. However, the third extension parts may be electrically connected to the other conduction patterns by bypassing the leading ends thereof, like some of the third extension parts h3a, h3b shown in FIG. 3A.

Also, in this illustrative embodiment, the configuration has been exemplified in which the third extension parts h3a, h3b are wider than the first extension parts h1a, h1b, respectively. However, the third extension parts h3a, h3b may be configured to have areas larger than those of the first extension parts h1a, h1b, respectively.

As described above, the electrode terminals dga, dgb of the LED 1g of the second group are respectively soldered and fixed to the lands r1, r2 of the FPC 3, so that the LED 1g of the second group is mounted on the FPC 3.

In the same manner, the electrode terminals dra, drb of the LED 1r of the first group and the electrode terminals dba, dbb of the LED 1b of the third group are also soldered and fixed to the pairs of corresponding lands r1, r2.

At this time, of the outlines of the pair of lands r1, r2, the lines i1, i2, i3 (which are shown with the solid lines in FIG. 4) of the land r1 and the lines i4, i5, i6 (which are shown with the solid lines in FIG. 4) of the land r2, to which the first extension parts h1a, h1b, the second extension parts h2a, h2b and the third extension parts h3a, h3b are not connected, may be set as a basis of self-alignment as regards bi-axial directions (X and Y directions) when mounting the LED 1 (1r, 1g, 1b). Specifically, the lines i1, i4 perpendicular to the X direction become a basis of the X direction and the lines i2, i3, i5, i6 perpendicular to the Y direction becomes a basis of the Y direction.

According to the conduction patterns having the above configurations, the following effects can be realized.

As a first effect, since the leading ends of the first extension parts h1a, h1b and the third extension parts h3a, h3b and most of the second extension parts h2a, h2b having the large width or large area are covered by the coverlay 4, the peeling strength of the first, second and third extension parts h1a, h1b, h2a, h2b, h3a, h3b, the wiring patterns p1 to p4 and the lands r1, r2 of the conduction patterns from the FPC 3 is improved and the peeling strength of the LED 1 from the FPC 3 is thus improved. As a result, it is possible to increase the mounting density of the LEDs 1 up to a level at which the coverlay 4 cannot be arranged between the adjacent LEDs 1. Actually, as shown in FIG. 3A, the openings 4k of the coverlay 4 are arranged between the adjacent LEDs 1.

As a second effect, the two extension parts, i.e., the first extension parts h1a, h1b and the second extension parts h2a, h2b, which extend forwards from the two corners of the two sides (upper side in FIG. 4) of the lands r1, r2 facing the light guide plate 2 to under the coverlay 4, are arranged, so that it is possible to effectively suppress the wirings (conduction patterns) from being peeled off from (the front part of the base material 3b of) the FPC 3 during the process of abutting the LEDs 1 to the light guide plate 2 (refer to FIG. 2) in an assembling process of the planar lighting device S. That is, the conduction patterns including the lands r1, r2 are formed as shown in FIG. 4, so that the peeling strength of the LED 1 (the fixing strength of the LED 1 to the FPC 3) is secured and the strength is thus secured.

As a third effect, the third extension parts h3a, h3b are formed to be wider or to have the larger area than the first extension parts h1a, h1b, so that it is possible to increase the peeling strength of the wiring (conduction pattern) at the rear side.

In back ground, an unbalance is caused because the parts corresponding to the second extension parts h2a, h2b do not exist at the opposite side (the lower side in FIG. 4) to the light guide plate 2. In the above configuration, the unbalance of the fixing strengths between the light guide plate 2-side and the opposite side to the light guide plate 2 (between the upper and lower sides in FIG. 4) is decreased. Accordingly, it is possible to supplement the deficiency in the peeling strength at the rear of the opposite side (the lower side in FIG. 4) to the light guide plate 2. It is effective in case that the peeling strength of the conduction pattern at the opposite side to the light guide plate 2 is to be a problem.

As a fourth effect, in the outlines of the pair of lands r1, r2 shown in FIG. 4, the parts (lines i1 to i6) (which are shown with the solid lines in FIG. 4) to which the first extension parts h1a, h1b, the second extension parts h2a, h2b and the third extension parts h3a, h3b are not connected, may be set as the basis of self-alignment as regards the bi-axial directions (X and Y directions in FIG. 4) when mounting the LED 1 on the FPC 3. As described above, the lines i1 and i4 become a basis of the X direction and the lines i2, i3, i5, i6 become the basis of the Y direction. Thereby, it is possible to secure the positional precision when mounting the LED 1.

From the first to fourth effects, it is possible to secure the peeling strength of the LED 1 from the FPC 3 and to achieve the narrow-pitch arrangement of the LEDs 1 by designing the shapes of the lands r1, r2 without arranging the coverlay 4 (the opening 4k of the coverlay 4 is arranged) between the lands r1, r2 on which the LED 1 is mounted, i.e., between the adjacent LEDs 1. Therefore, it is possible to form the LED mounting land pattern for narrow LED pitch.

Since it is possible to arrange more LEDs 1 in the limited space, it is possible to achieve the planar lighting device S of high brightness.

Since the break of the conduction pattern is prevented, it is possible to achieve the planar lighting device S having high reliability.

Since it is possible to perform the self-alignment with high precision when mounting the LED, it is possible to achieve the planar lighting device S capable of stably providing the high brightness and uniform lighting.

<The Other Illustrative Embodiments>

In the above illustrative embodiment, the LED 1 as the point-like light source has been exemplified. However, the light source having a shape other than the point-like light source may be used such as linear light source and planar light source as long as this disclosure can be applied thereto.

Also, in the above illustrative embodiment, the configuration has been exemplified in which the gap s1 having the stripe shape is formed between the second extension parts h2a, h2b. However, the gap is not limited to the stripe shape. However, it is preferable to form a narrow gap between the second extension parts h2a, h2b because it is possible to form the second extension parts h2a, h2b having the larger area.

In the above illustrative embodiment, the FPC 3 has been exemplified as the substrate on which the light source is mounted. However, a substrate other than the FPC 3 may be adopted as long as this disclosure can be applied thereto. However, the FPC 3 is very suitable for the planar lighting device S having the narrow space.

In the above illustrative embodiment, the white LED has been exemplified as the LED 1. However, an LED having a different color may be adopted as the LED 1.

Also, in the above illustrative embodiment, this disclosure is applied to the planer light emitting device. However, this disclosure is applied to the substrate on which the light source is mounted.

Although the illustrative embodiment of this disclosure has been described, the description is only representative. Therefore, a variety of modifications and changes can be made within the scope of this disclosure. That is, this disclosure can be appropriately arbitrarily changed without changing the gist of this disclosure.

What is claimed is:

1. A planar lighting device comprising:
a light guide plate;
a plurality of light sources that is arranged in a line shape along a longitudinal direction of a side end face of the light guide plate, and
a mounting substrate, on which the light sources are respectively mounted,
wherein the mounting substrate has a base material and a conduction pattern formed on the base material, and a cover member is arranged on the conduction pattern,
wherein the conduction pattern comprises a plurality of pairs of lands, which is provided in the longitudinal direction to be corresponding to a pair of electrode terminals of each light source and to which the pair of electrode terminals is respectively connected, and extension parts that are respectively connected to the pair of lands,
wherein the cover member has an opening that exposes together the two lands, which face each other, of the two pairs of lands, which are respectively corresponding to the two adjacent light sources, and
wherein the extension parts comprise:
a first extension part that is formed to extend from a first end portion of the lands, which faces the land of the adjacent light source, toward the light guide plate and to extend under the cover member;
a second extension part that is formed to extend from a second end portion, which is opposite to the first end portion of the corresponding land in the longitudinal direction, toward the light guide plate and the other land of the pair of the lands and to extend under the cover member; and
a third extension part that is formed to extend from the first end portion, to which the first extension part is provided, toward an opposite side to the light guide plate and to extend under the cover member.

2. The planar lighting device according to claim 1, wherein the third extension part is formed to be wider than the first extension part.

3. The planar lighting device according to claim 1, wherein the third extension part is formed to have a larger area than the first extension part.

4. The planar lighting device according to claim 1, wherein the second extension part, which is provided to each light source, has a wide shape so that a gap having a stripe shape is formed between the second extension part of one of the pair of the lands and the second extension part of the other of the pair of the lands.

5. The planar lighting device according to claim 1, wherein the conduction pattern comprises a wiring pattern to which at least a part of the extension part is electrically connected, and
wherein the wiring pattern is formed so that the one light source can be driving-controlled independently from the other adjacent light source.

6. A planar lighting device comprising:
a light guide plate;
a plurality of light sources that is arranged in a line shape along a longitudinal direction of a side end face of the light guide plate, and
a mounting substrate on which the light sources are respectively mounted,
wherein a cover member is arranged on a conduction pattern that is formed on a base material of the mounting substrate,
wherein the conduction pattern comprises a plurality of pairs of lands, which is provided with centering around the light source in the longitudinal direction to be corresponding to a pair of electrode terminals of each light source and to which the pair of electrode terminals is respectively connected, and extension parts that are connected to the pair of lands,
wherein the cover member has an opening that exposes the two lands, which face each other, of the two pairs of lands, which are respectively corresponding to the two adjacent light sources, and
wherein the extension part comprises:
an outside extension part is formed to extend from a first end portion of the lands, which faces the land of the adjacent light source, toward the light guide plate and an opposite side to the light guide plate and to extend under the cover member; and
an inside extension part that is formed to extend from a second end portion, which is opposite to the first end portion of the corresponding land in the longitudinal direction, toward the light guide plate and to extend under the cover member.

7. The planar lighting device according to claim 6, wherein a gap is formed between a pair of the inside extension parts that is provided to each light source.

8. The planar lighting device according to claim 6, wherein an area of the outside extension part, which extends toward the opposite side to the light guide plate, is formed to be wider than an area extending toward the light guide plate.

9. The planar lighting device according to claim 6, wherein an area of the outside extension part, which extends toward the opposite side to the light guide plate, is formed to have a larger area than an area extending toward the light guide plate.

10. The planar lighting device according to claim 6, wherein the one light source is driving-controlled independently from the other adjacent light source.

11. The planar lighting device according to claim 1, wherein the mounting substrate is a flexible printed circuit board.

12. A mounting substrate, on which light sources are respectively mounted along a longitudinal direction of the mounting substrate, comprising:
a base material;
a conduction pattern that is formed on the base material; and
a cover member that is arranged on the conduction pattern;
wherein the conduction pattern comprises a plurality of pairs of lands, which is provided with centering around the light source in the longitudinal direction to be corresponding to a pair of electrode terminals of each light source and to which the pair of electrode terminals is respectively connected, and extension parts that are connected to the pair of lands,
wherein the cover member has an opening that exposes both one of the pair of the lands of a first light source and one of the pair of the lands of a second light source adjacent to the first light source, which face each other,
wherein the extension part comprises:
an outside extension part that is formed to extend from one end of the lands in a first direction and a second direction, which is opposite to the first direction, and to extend under the cover member; and an inside extension part that is formed to extend from the other end of the lands in the first direction and a direction toward the other land of the pair of the lands of the respective light sources and to extend under the cover member.

wherein the first direction and the second direction are perpendicular to the longitudinal direction of the mounting substrate.

13. A mounting substrate, on which a plurality of light sources are arranged in a line shape along a longitudinal direction of the substrate and along a longitudinal direction of a side end face of a light guide plate, comprising:

a conduction pattern that is formed on a base material of the mounting substrate; and a cover member arranged on the conduction pattern, wherein the conduction pattern comprises a plurality of pairs of lands, which is provided with centering around the light source in the longitudinal direction to be corresponding to a pair of electrode terminals of each light source and to which the pair of electrode terminals is respectively connected, and extension parts that are connected to the pair of lands, wherein the cover member has an opening that exposes the two lands, which face each other, of the two pairs of lands, which are respectively corresponding to the two adjacent light sources, and wherein the extension parts comprise:

an outside extension part is formed to extend from a first end portion of the lands, which faces the land of the adjacent light source, toward the light guide plate and an opposite side to the light guide plate and to extend under the cover member; and an inside extension part that is formed to extend from a second end portion, which is opposite to the first end portion of the corresponding land in the longitudinal direction, toward the light guide plate and to extend under the cover member.

\* \* \* \* \*